United States Patent [19]

Tajima

[11] Patent Number: 5,632,158
[45] Date of Patent: May 27, 1997

[54] ELECTRONIC COMPONENT COOLING UNIT

[75] Inventor: Makoto Tajima, Tokyo, Japan

[73] Assignee: Calsonic Corporation, Tokyo, Japan

[21] Appl. No.: 617,556

[22] Filed: Mar. 19, 1996

[30] Foreign Application Priority Data

Mar. 20, 1995 [JP] Japan .................. 7-061309

[51] Int. Cl.⁶ ......................................... H01L 23/36
[52] U.S. Cl. ........................ 62/259.2; 165/104.33; 361/700
[58] Field of Search ................... 62/259.1; 165/104.26, 165/104.33; 361/700

[56] References Cited

U.S. PATENT DOCUMENTS

| | | | |
|---|---|---|---|
| 1,693,324 | 11/1928 | Stephens | 165/104.33 |
| 2,958,021 | 10/1960 | Cornelison et al. | 165/104.33 X |
| 4,293,030 | 10/1981 | Rambach | 165/104.33 X |
| 4,549,603 | 10/1985 | Shirai et al. | 165/104.33 |
| 4,633,371 | 12/1986 | Nagy et al. | 361/385 |
| 4,833,567 | 5/1989 | Saaski et al. | 361/385 |
| 4,912,548 | 3/1990 | Shanker et al. | 357/82 |
| 5,168,919 | 12/1992 | Berenholz et al. | 165/104.33 X |
| 5,216,580 | 6/1993 | Davidson et al. | 361/385 |
| 5,252,778 | 10/1993 | Ogawa | 165/104.33 X |
| 5,305,184 | 4/1994 | Andresen et al. | 165/104.33 X |
| 5,323,292 | 6/1994 | Brzezinski | 165/104.33 X |
| 5,331,510 | 7/1994 | Ouchi et al. | 361/702 |
| 5,396,947 | 3/1995 | Itoh | 165/104.14 |
| 5,529,115 | 6/1996 | Paterson | 165/104.33 |

FOREIGN PATENT DOCUMENTS

| | | | |
|---|---|---|---|
| 1266244 | 5/1961 | France | 165/104.33 |
| 21441 | 2/1978 | Japan | 165/104.33 |
| 55-75198 | 5/1980 | Japan . | |
| 131755 | 8/1983 | Japan | 165/104.33 |
| 589631 | 1/1978 | U.S.S.R. | 165/104.33 |

*Primary Examiner*—William Doerrler
*Attorney, Agent, or Firm*—Sughrue, Mion, Zinn, Macpeak & Seas

[57] ABSTRACT

In an electronic component cooling unit, one surface of a cold plate, on the other surface of which an electronic component is mounted, is covered with a cover to form a tank section in which a refrigerant is stored, a container pipe is extended from the cover in such a manner that the container pipe is communicated with the tank section, a wick pole is fitted in the container pipe so that a plurality of axial passageways are formed in the container pipe, and air is removed from the tank section and the axial passageways.

3 Claims, 4 Drawing Sheets

ELECTRONIC COMPONENT COOLING UNIT

BACKGROUND OF THE INVENTION

The present invention relates to an electronic component cooling unit which is used to cool electronic components such as rectifier diodes and LSI chips which generate heat.

A heat sink for cooling an electronic component such as a rectifier diode or LSI chip which generates heat has been disclosed, for instance, by Japanese Utility Model Unexamined Publication No. Sho. 55-75198.

The heat sink is as shown in FIG. 7. In the heat sink, an electronic component 13 such as a rectifier diode which generates heat is fixedly mounted on one side of a mounting member 11, on the other side of which a plurality of heat radiating plates 17 (hereinafter referred to merely as "radiating plates 17", when applicable) is mounted.

Corrugated radiating fins 19 (hereinafter referred to merely as "radiating fins 19", when applicable) are arranged between the heat radiating plates 17.

In the heat sink of this type, the heat generated by the electronic component 13 is transmitted through the mounting member 11 and the radiating plates 17 to the radiating fins 19, and then radiated into the outside air through the radiating fins 19. Hence, the electronic component 13 is effectively cooled.

However, the conventional heat sink designed as described above suffers from the following difficulties: The electronic component 13 is cooled by natural heat radiation with the aid of the radiating plates 17 and the corrugated radiating fins 19. Hence, the sink is low in cooling efficiency.

In addition, the sink suffers from a problem in the case where the electronic component 13 is bulky; that is, it is large in the amount of heat radiation. In this case, it is necessary to increase the length of the radiating plates 17. However, as the radiating plates 17 are elongated, the efficiency with which the radiating plates 17 transmit heat to the radiating fins is lowered as much as the thermal conductivity. Hence, even if the number of radiating fins 19 is increased to increase the heat radiating area, the cooling power is not increased so much. This means that it is difficult to more effectively radiate the heat from the electronic component 13.

SUMMARY OF THE INVENTION

Accordingly, an object of the invention is to eliminate the above-described difficulties accompanying a conventional electronic component cooling unit. More specifically, an object of the invention is to provide an electronic component cooling unit which is much higher in electronic-component cooling efficiency than a conventional one.

In an electronic component cooling unit according to a first aspect of the invention, one surface of a cold plate, on the other surface of which an electronic component is mounted, is covered with a cover member to form a tank section in which a refrigerant is stored; a container pipe is extended from the cover member in such a manner that the container pipe is communicated with the tank section; a wick pole is fitted in the container pipe so that a plurality of axial passageways are formed in the container pipe, and with air removed from the tank section and the axial passageways, a refrigerant is sealingly filled in the tank section and the axial passageways.

An electronic component cooling unit according to a second aspect of the invention is characterized in that in the unit of the first aspect, the other surface of the cold plate has a recess which forms the tank section, and the bottom of the recess is finely roughened.

In the electronic component cooling unit of the first aspect, the heat generated by the electronic component mounted on one surface of the cold plate is transmitted to the other (opposite) surface of the cold plate.

Although the heat thus transmitted heats the refrigerant in the tank section, since air has been removed from the tank section and the axial passageways, the refrigerant is evaporated at a relatively low temperature, and is moved, in the form of a pressure wave, in the axial passageways towards the ends at a sonic velocity.

When flowing in the axial passageways in the above-described manner, the refrigerant performs heat exchange with the outside air, so that it is cooled and condensed; that is, it is liquified. The refrigerant thus liquified flows down into the tank section.

In the electronic component cooling unit of the second aspect, the cold plate has the recess which forms the tank section. Hence, the heat generated by the electronic component uniformly heats the refrigerant stored in the recess.

DETAILED DESCRIPTION OF THE PREFERRED EMBODMENTS

The invention will be described with reference to its preferred embodiments shown in the accompanying drawings in detail.

Figure 1:
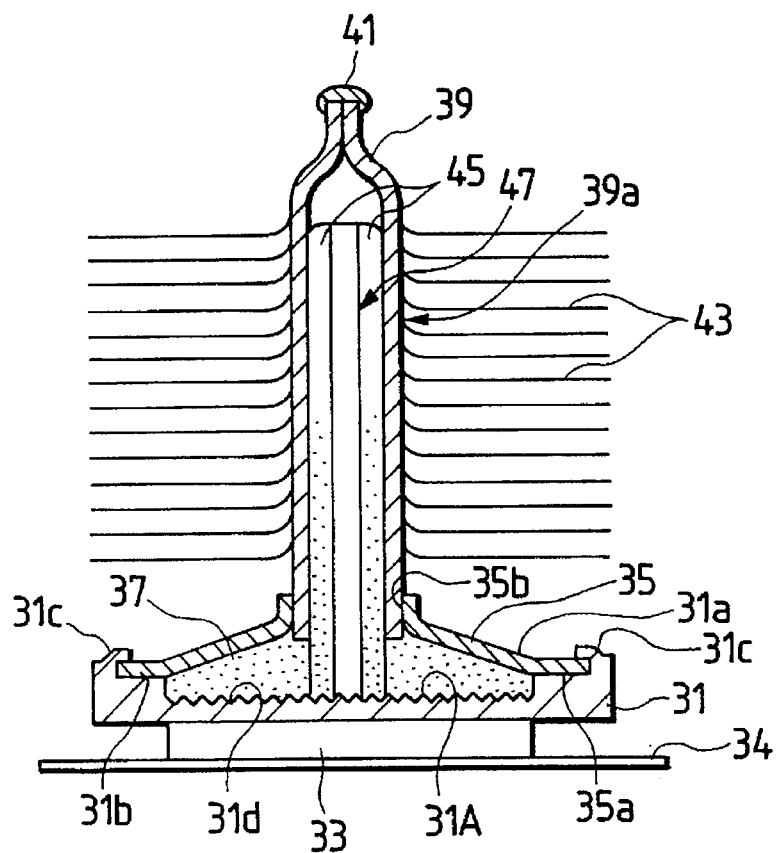
FIG. 1 is a sectional view of an electronic component cooling unit, which constitutes a first embodiment of the invention.

FIG. 1 shows an electronic component cooling unit, which constitutes a first embodiment of the invention. In FIG. 1, reference numeral 31 designates a rectangular cold plate.

The cold plate 31 is made of a metal material such as aluminum high in thermal conductivity.

An electronic component 33 such as an LSI chip or a multi-chip module (MCM) formed by integrating LSIs is bonded to one surface of the cold plate 31 through an adhesive agent high in thermal conductivity.

The electronic component 33 is provided on a printed circuit board 34.

The other (opposite) surface of the cold plate 31 has a circular recess 31a. In addition, thin grooves 31A are formed in the bottom of the recess 31a of the cold plate 31. Furthermore, an engaging recess 31b is formed in the peripheral portion of the recess 31a, and caulking pawls 31c are formed outside the engaging recess 31b.

The bottom (or body) 35a of a circular cover member 35 is fitted in the engaging recess 31b, and secured to the cold plate 31 with the caulking pawls 31c.

The cover member 35 and the recess 31a form a tank section 37.

The cover member 35 is also made of a metal material such as aluminum high in thermal conductivity.

The cover member 35 has a circular mounting hole 35b at the center, into which a container pipe 39 is inserted.

The container pipe 39 is also made of a metal material such as aluminum high in thermal conductivity.

The outer end portion 41 of the container pipe 39 is sealed by cold forging or welding.

The container pipe 39 includes a heat exchanger section 39a. Rectangular or circular heat radiating fins 43 (hereinafter referred to merely as "radiating fins 43" when applicable) are mounted on the heat exchanger section 39a of the container pipe 39 at predetermined intervals in the axial direction of the latter.

The radiating fins 43 are also made of a metal material such as aluminum high in thermal conductivity.

A wick pole 47 is inserted into the container pipe 39 to form a plurality of axial passageways 45 in the container pipe 39 in such a manner that the passageways 45 are axially extended in the container pipe 39.

The wick pole 47 is also made of a metal material such as aluminum high in thermal conductivity.

Figure 2:
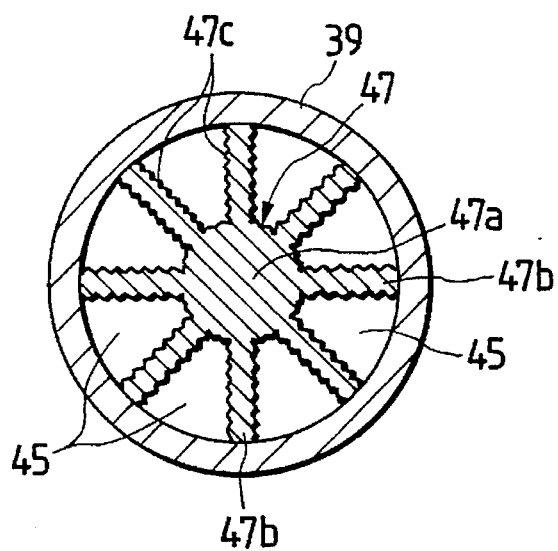
FIG. 2 is a sectional view of a container pipe and a wick pole in the electronic component cooling unit shown in FIG. 1.

The wick pole 47, as shown in FIG. 2, comprises an axial portion 47a extended along the central axis; and a plurality of protrusions 47b which are extended radially outwardly of the axial portion 47a. Fine (narrow) grooves 47c are formed in the surfaces of the protrusions 47b in such a manner that they are extended axially.

One end of the wick pole 47 is abutted against the cold plate 31.

Figure 3:
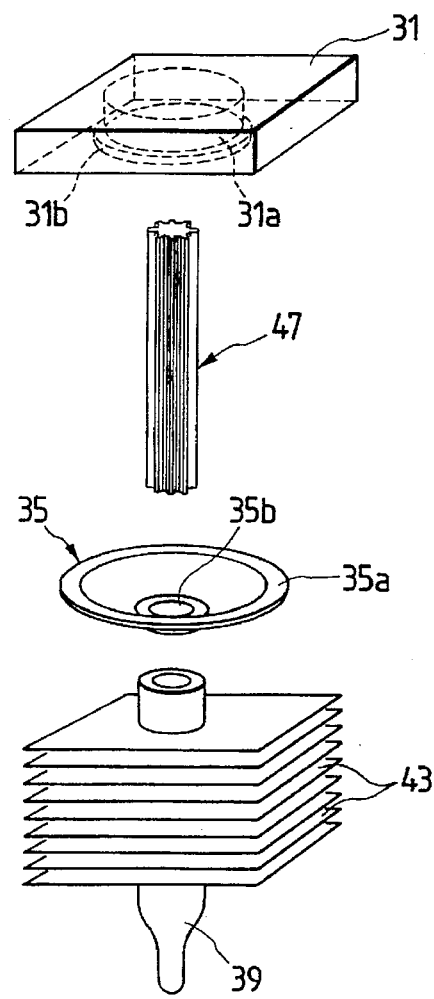
FIG. 3 is an exploded perspective view of the electronic component cooling unit shown in FIG. 1.

The above-described electronic component cooling unit is manufactured as follows:

First, as shown in FIG. 3, a number of radiating fins 43 are set at predetermined intervals, and then the container pipe 39 is inserted into the array of fins 43 thus set. And, the end portion of the container pipe 39 is fitted in the mounting hole 35b of the cover member 35.

Thereafter, the wick pole 47, the outside diameter of which is slightly larger than the inside diameter of the container pipe 39, is press-fitted in the pipe 39, so that, while the container pipe 39 is slightly increased in diameter, the heat radiating fins 43 and the cover member 35 are fixedly mounted on the container pipe 39.

Under this condition, the engaging recess 31b of the cold plate 31 is engaged with the bottom 35a of the cover member 35, and the caulking pawl 31c are bent so that the cold plate 31 is fixedly combined with the cover member 35.

Thereafter, those component thus roughly assembled is subjected to blazing in the blazing oven, thus being positively assembled into one unit.

Figure 4:
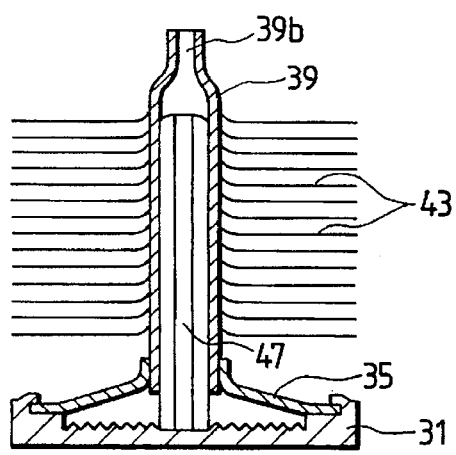
FIG. 4 is a sectional view showing the state of the electronic component cooling unit before air is removed.

Under this condition, as shown in FIG. 4, the end of the container pipe 39 is opened yet; that is, the pipe 39 has the refrigerant pouring inlet 39b at the end. A predetermined quantity of refrigerant such as water is poured into the tank section 37, and thereafter air is removed from the tank section 37 and the axial passageways 45 to a pressure of about $10^{-5}$ Torr through the refrigerant pouring inlet 39b, and then the refrigerant pouring inlet 39b is sealingly closed with a sealing member 41.

In the electronic component cooling unit thus constructed, the heat generated by the electronic component mounted on one surface of the cold plate 31 is transmitted to the bottom 31d of the recess 31a formed in the cold plate 31.

The heat thus transmitted heats and boils the refrigerant in the tank section. Since air has been removed from the tank section 37 and the axial passageways, the refrigerant is evaporated at a relatively low temperature, and the refrigerant thus evaporated is moved, in the form of a pressure wave, in the axial passageways towards the ends at a sonic velocity.

While flowing in the axial passageways 45 of the container pipe in the above-described manner, the refrigerant performs heat exchange with the outside air, so that it is cooled and condensed; that is, it is liquified. The refrigerant thus liquified is collected at the fine grooves 47c formed in the surfaces of the wick pole 47, thus flowing down the grooves 47c into the cold plate 31.

In the electronic component cooling unit, as was described before, air has been removed from the tank section 37 and the axial passageways 45, and therefore the refrigerant in the tank section 37 is evaporated at a relatively low temperature. The refrigerant thus evaporated is moved, in the form of a pressure wave, in the axial passageways at a sonic velocity, while performing heat exchange with the outside air, so that it is cooled and condensed; that is, it is liquified. The refrigerant thus liquified is collected at the fine grooves 47c formed in the surfaces of the wick pole 47, thus flowing down the grooves 47c into the cold plate 31. Hence, the electronic component cooling unit is much higher in cooling efficiency than the conventional one.

That is, in the electronic component cooling unit, with the refrigerant evaporated in a vacuum, the heat generated by the electronic component is led to the heat exchanger section 39a of the container pipe 39. Hence, with the cooling unit, the heat generated by the electronic component is led to the heat exchanger section 39a with high efficiency. In other words, the method of the invention is much higher in electronic component cooling efficiency than the conventional method in which heat is transmitted by only thermal conduction, and radiated with radiating fins.

Hence, when compared with the conventional heat sink in which the electronic component is cooled by natural heat radiation only, the electronic component cooling unit of the invention can be miniaturized, and is able to radiate a large amount of heat.

Furthermore, in the above-described electronic component cooling unit, the cold plate 31 has the recess 31a which forms the tank section 37. Hence, the heat generated by the electronic component can be transmitted to the recess 31a with high efficiency.

In addition, in the above-described electronic component cooling unit, the radiating fins 43 are arranged at the heat exchanger section 39a of the container pipe 39, the effectiveness of heat exchange of the refrigerant with the outside air is greatly improved.

Moreover, in the above-described electronic component cooling unit, the refrigerator flows uniformly over the whole surface of the cold plate 31; that is, the cold plate 31 has no heat spot, and therefore the electronic component 33 attached thereto can be positively protected.

Furthermore, in the above-described electronic component cooling unit, the wick pole 47 is abutted against the bottom 31d of the recess 31a formed in the cold plate 31. Hence, when evacuated, the tank section 37 is maintained sufficiently high in mechanical strength.

Figure 5:
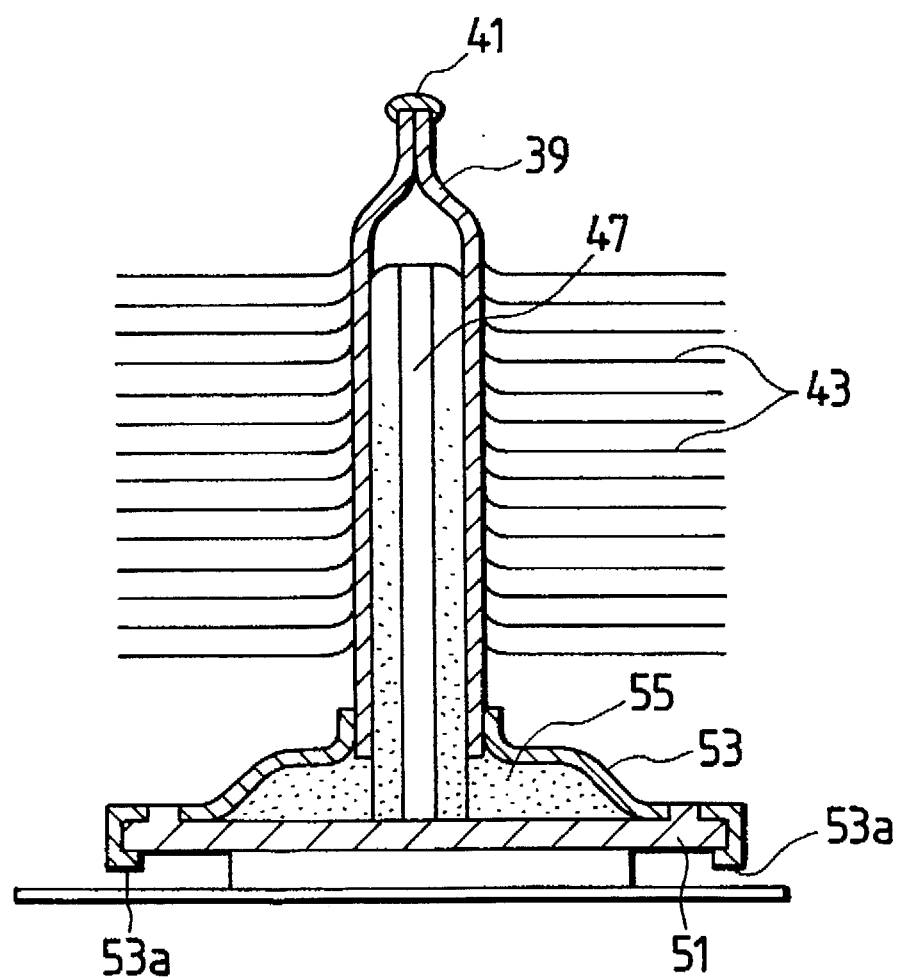
FIG. 5 is a sectional view of an electronic component cooling unit, which constitutes a second embodiment of the invention.

FIG. 5 shows an electronic component cooling unit, which constitutes a second embodiment of the invention. In the second embodiment, the cold plate has no recess, and a tank section 55 is formed only with a cover member 53.

Figure 6:
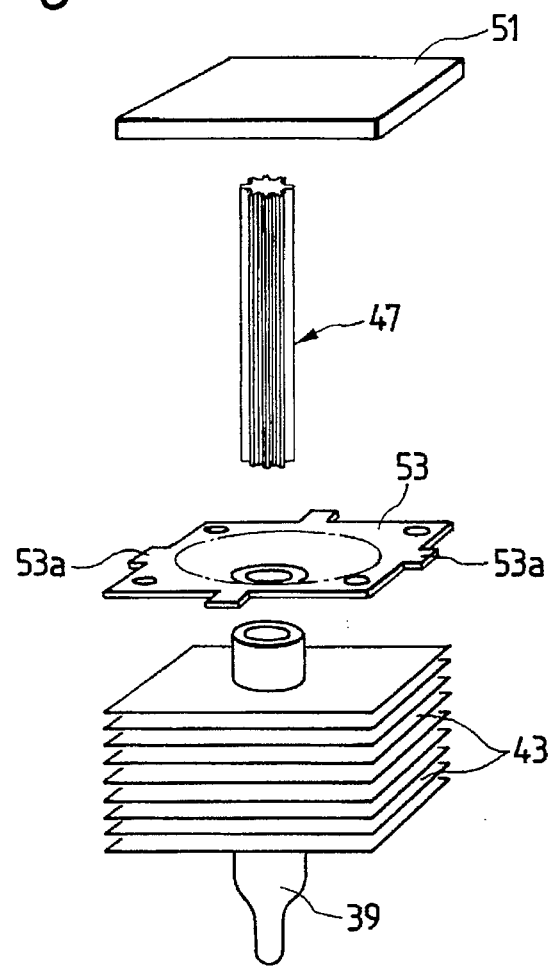
FIG. 6 is an exploded perspective view of the electronic component cooling unit shown in FIG. 5.
Figure 7:
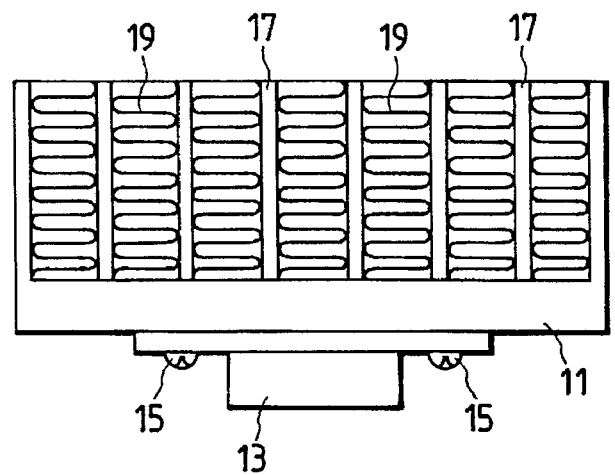
FIG. 7 is a side view of a conventional heat sink.

The cover member 53, as shown in FIG. 6, is rectangular, and has caulking pawls on its periphery, so that the cover member 53 is fixedly coupled to the cold plate 51.

The second embodiment has the same effects or merits as the above-described first embodiment.

In the above-described embodiments, the technical concept of the invention is applied to the protection of the electronic component 33 such as an MCM; however, the invention is not limited thereto or thereby. That is, it goes without saying that the invention is widely applicable to a variety of electronic elements which generate heat.

As was described above, in the electronic component cooling unit of the first aspect, the tank section and the axial passageways form one container, which is evacuated. Hence, the refrigerant in the tank section is evaporated at a relatively low temperature, and is moved, in the form of a pressure wave, in the axial passageways towards the ends, while performing heat exchange with the outside air. Hence, it is cooled and condensed. That is, it is liquified, and led into the tank section. Thus, electronic component cooling unit of the invention is much higher in electronic component cooling efficiency than the conventional one.

In the electronic component cooling unit of the second aspect, the cold plate has the recess which forms the tank section. Hence, the heat generated by the electronic component uniformly heats the refrigerant stored in the recess of the cold plate. Hence, the electronic component has no heat spot. This means that the electronic component cooling unit of the invention is high in cooling efficiency.

What is claimed is:

1. An electronic component cooling unit, comprising:

a cold plate, an electronic component being mounted on one surface of said cold plate;

a cover member covering the other surface of said cold plate to constitute a tank section in which a refrigerant is stored;

a container pipe extending from said cover member in such a manner that said container pipe is communicated with said tank section; and a wick pole being fitted in said container pipe, said wick pole including an axial portion extending along a central longitudinal axis of said container pipe, and a plurality of radial protrusions extending outwardly from said axial portion, so that a plurality of axial passageways are formed in said container pipe, said tank section and said axial passageways being evacuated into a vacuum.

2. An electronic component cooling unit as claimed in claim 1, wherein said other surface of said cold plate has a recess which constitutes said tank section.

3. An electronic component cooling unit as claimed in claim 2, wherein a bottom of said recess has fine roughness.

* * * * *